United States Patent
Li et al.

(10) Patent No.: US 10,028,389 B2
(45) Date of Patent: Jul. 17, 2018

(54) FLEXIBLE PRINTED CIRCUIT BOARD, METHOD FOR MANUFACTURING THE SAME, AND DISPLAY DEVICE

(71) Applicants: BOE TECHNOLOGY GROUP CO., LTD., Beijing (CN); BOE (HEBEI) MOBILE DISPLAY TECHNOLOGY CO., LTD., Gu'An, Hebei (CN)

(72) Inventors: Xuefeng Li, Beijing (CN); Dahua Zhu, Beijing (CN)

(73) Assignees: BOE TECHNOLOGY GROUP CO., LTD., Beijing (CN); BOE (HEBEI) MOBILE DISPLAY TECHNOLOGY CO., LTD., Gu'An, Hebei (CN)

(*) Notice: Subject to any disclaimer, the term of this patent is extended or adjusted under 35 U.S.C. 154(b) by 0 days.

(21) Appl. No.: 14/913,935

(22) PCT Filed: Sep. 14, 2015

(86) PCT No.: PCT/CN2015/089501
§ 371 (c)(1),
(2) Date: Feb. 23, 2016

(87) PCT Pub. No.: WO2016/161762
PCT Pub. Date: Oct. 13, 2016

(65) Prior Publication Data
US 2017/0042035 A1   Feb. 9, 2017

(30) Foreign Application Priority Data

Apr. 9, 2015  (CN) .......................... 2015 1 0166738

(51) Int. Cl.
*H05K 1/00*  (2006.01)
*H05K 1/18*  (2006.01)
(Continued)

(52) U.S. Cl.
CPC ....... *H05K 1/189* (2013.01); *G02F 1/133305* (2013.01); *H05K 1/028* (2013.01);
(Continued)

(58) Field of Classification Search
CPC .......... H05K 2201/09709; H05K 2201/09727; H05K 1/189; H05K 1/118; H05K 3/361;
(Continued)

(56) References Cited

U.S. PATENT DOCUMENTS 3,033,914 A * 5/1962 Alfonso Acosta-Lleras ...... H05K 1/0287
174/254
4,850,883 A * 7/1989 Kabadi .................. H01R 12/62
439/329

(Continued)

FOREIGN PATENT DOCUMENTS

| CN | 101496455 A | 7/2009 |
| CN | 101636037 A | 1/2010 |

(Continued)

OTHER PUBLICATIONS

Second Office Action regarding Chinese application No. 201510166738.X, dated Sep. 6, 2016. Translation provided by Dragon Intellectual Property Law Firm.

(Continued)

*Primary Examiner* — James Wu
(74) *Attorney, Agent, or Firm* — Harness, Dickey & Pierce, P.L.C.

(57) ABSTRACT

The present disclosure provides a flexible printed circuit board, a method for manufacturing the same and a display device. The flexible printed circuit board includes a first component and a second component, wherein the first component includes a main body and a first connection portion, wherein at least one first signal line is arranged in the main (Continued)

body and the first connection portion; the second component includes a connector and a second connection portion, wherein a second signal line corresponding to the first signal line is arranged in the connector and the second connection portion; the first connection portion and the second connection portion are connectable to each other, so as to electrically connect the first signal line to the corresponding second signal line.

19 Claims, 4 Drawing Sheets

(51) Int. Cl.
| | |
|---|---|
| H05K 7/00 | (2006.01) |
| G02F 1/1333 | (2006.01) |
| H05K 1/02 | (2006.01) |
| H05K 1/14 | (2006.01) |
| H05K 3/36 | (2006.01) |
| H05K 1/11 | (2006.01) |

(52) U.S. Cl.
CPC ............ *H05K 1/118* (2013.01); *H05K 1/142* (2013.01); *H05K 3/361* (2013.01); *H05K 2201/09709* (2013.01); *H05K 2201/09727* (2013.01); *H05K 2201/10136* (2013.01)

(58) Field of Classification Search
CPC ................... H05K 1/028; H05K 1/142; H05K 2201/10136; H05K 1/117; H01R 12/7076; G02F 1/133305
See application file for complete search history.

(56) References Cited

U.S. PATENT DOCUMENTS

| | | | | |
|---|---|---|---|---|
| 5,917,149 | A * | 6/1999 | Barcley ................ | H05K 1/0281 |
| | | | | 174/36 |
| 6,274,819 | B1 * | 8/2001 | Li ........................ | H05K 1/0293 |
| | | | | 174/254 |
| 7,267,552 | B2 * | 9/2007 | Lin ...................... | H01R 12/592 |
| | | | | 174/117 FF |
| 9,055,684 | B2 * | 6/2015 | Xie ........................ | H05K 1/117 |
| 2006/0256537 | A1 * | 11/2006 | Muroki ................ | H05K 1/0269 |
| | | | | 361/739 |
| 2009/0233459 | A1 * | 9/2009 | Shiramizu .............. | H05K 1/117 |
| | | | | 439/60 |

FOREIGN PATENT DOCUMENTS

| | | |
|---|---|---|
| CN | 201757315 U | 3/2011 |
| CN | 202102688 U | 1/2012 |
| CN | 102843856 A | 12/2012 |
| CN | 202652688 U | 1/2013 |
| CN | 203520366 U | 4/2014 |
| CN | 104837294 A | 8/2015 |
| TW | 200710672 A | 3/2007 |

OTHER PUBLICATIONS

First Office Action regarding Chinese application No. 201510166738.X, dated Mar. 29, 2016. Translation provided by Dragon Intellectual Property Law Firm.
Written Opinion of the International Searching Authority for international application No. PCT/CN2015/089501.

* cited by examiner

FLEXIBLE PRINTED CIRCUIT BOARD, METHOD FOR MANUFACTURING THE SAME, AND DISPLAY DEVICE

CROSS-REFERENCE TO RELATED APPLICATIONS

This application is the U.S. National Phase of PCT Application No. PCT/CN2015/089501 filed on Sep. 14, 2015, which claims priority to Chinese Patent Application No. 201510166738.X filed on Apr. 9, 2015, the disclosures of which are incorporated in their entirety by reference herein.

TECHNICAL FIELD

The present disclosure relates to the field of flexible printed circuit board technology, and in particular to a flexible printed circuit board, a method for manufacturing the same and a display device.

BACKGROUND

Flexible printed circuit board (FPC) is a printed circuit made by flexible insulated materials. The FPC has a good electrical property, such that a more compact and a higher-density mounting may be realized. The FPC may be freely bended, winded, folded, capable of resisting million times of dynamic bending without broking the wires, which may be arranged freely according to a spatial arrangement and may move and stretch out and draw back in the three-dimension space, thereby integrating a component assembling and wires connection. The FPC has been wide applied in the fields such as aerospace, military, mobile communication, laptop, computer peripherals, PDA and digital camera.

A liquid crystal display module is generally connected to a mainboard via a FPC. As shown in FIG. 1, a main body 11 of a FPC is connected to a liquid crystal display module, and a connector 21 of the FPC is connected to a mainboard. An intermediate portion 3 between the main body 11 of the FPC and the connector 21 thereof is generally vimineous. When the main body 11 of the FPC is connected to the liquid crystal display module, and the connector 21 of the FPC is connected to the mainboard, the FPC is bended at the intermediate portion 3, so as to arrange the mainboard behind the liquid crystal display module.

The applicant finds in the related art the following issues. In the related art, a FPC is cut off from a big sheet material. The intermediate portion 3 is generally bended and vimineous, so it is difficult to make the FPCs arranged closely, and there may be relative big gaps between the FPCs. Therefore, it is difficult to determine the certain shape which the FPC is to be cut into, such that the big sheet material may not be fully used, thereby a use ratio of the FPC material is low, production efficiency is low, and manufacturing cost is high.

SUMMARY

In order to solve the problem in the related art that it is difficult to determine the certain shape which the FPC is to be cut into and the big sheet material is wasted because the intermediate portion is generally bended and vimineous, a flexible printed circuit board is provided.

The technical solution of the present disclosure is described in the following.

A flexible printed circuit board is provided, including a first component and a second component, wherein the first component includes a main body and a first connection portion, wherein at least one first signal line is arranged in the main body and the first connection portion; the second component includes a connector and a second connection portion, wherein a second signal line corresponding to the first signal line is arranged in the connector and the second connection portion; the first connection portion and the second connection portion are connectable to each other, so as to electrically connect the first signal line to the corresponding second signal line.

Optionally, the connector is flexible.

Optionally, the first connection portion and the second connection portion are bound together via a conductive double-side adhesive tape.

Optionally, a first connection member is arranged in the first connection portion, and a second connection member is arranged in the second connection portion; the first connection member and the second connection member are connected to each other by insertion, so as to electrically connect the first signal line to the corresponding second signal line.

Optionally, at least one alignment hole is arranged at each of the first connection portion and the second connection portion.

Optionally, a first intermediate portion is arranged between the main body and the first connection portion, and a second intermediate portion is arranged between the connector and the second connection portion; the first connection portion is wider than the first intermediate portion along a direction of a line connecting the first connection portion and the first intermediate portion; the second connection portion is wider than the second intermediate portion along a direction of a line connecting the second connection portion and the second intermediate portion.

Optionally, each first signal line includes in the first connection portion a widening part which is wider than the first signal line in the main body, and the first signal lines include first-type signal lines and second-type signal lines which are arranged alternately, wherein a distance between the widening part of each first-type signal line and the first intermediate portion is different from a distance between the widening part of each second-type signal line and the first intermediate portion; each second signal line includes in the second connection portion a widening part which is wider than the second signal line in the connector, and the second signal lines include third-type signal lines and fourth-type signal lines which are arranged alternately, wherein a distance between the widening part of each third-type signal line and the second intermediate portion is different from a distance between the widening part of each fourth-type signal line and the second intermediate portion.

Optionally, an aggregate thickness of a portion formed by connecting the first connection portion and the second connection portion is 0.1-0.2 mm.

A method for manufacturing a flexible printed circuit board is further provided by the present disclosure, including aligning and connecting a first connection portion of a first component to a second connection portion of a second component, so as to electrically connect a first signal line to a corresponding second signal line; wherein the first component includes a main body and the first connection portion, and at least one first signal line is arranged in the main body and the first connection portion; and the second component includes a connector and the second connection portion, and the second signal line corresponding to the first signal line is arranged in the connector and the second connection portion.

Optionally, the step of aligning and connecting the first connection portion of the first component to the second connection portion of the second component includes: binding the first connection portion and the second connection portion together via a conductive double-side adhesive tape.

Optionally, the binding is performed at 140-160 degrees centigrade and at a binding pressure of 5-20 MPa for 4-8 seconds.

Optionally, the method further includes forming a first connection member in the first connection portion and forming a second connection member in the second connection portion; and the step of aligning and connecting the first connection portion of the first component to the second connection portion of the second component includes: connecting the first connection member and the second connection member to each other by insertion, so as to electrically connect the first signal line to the corresponding second signal line.

A display device is further provided by the present disclosure, including the flexible printed circuit board hereinabove.

When the flexible printed circuit board hereinabove is used, the flexible printed circuit board is connected to a display panel via the main body of the first component, and flexible printed circuit board is connected to a mainboard via the connector of the second component.

The flexible printed circuit board provided by the present disclosure includes two components which are connected to each other to realize the function of the printed circuit board. When manufacturing the flexible printed circuit board, the two components may be cut off from a big sheet material respectively. Because each component is small and of a simple shape, the components are easy to be arranged closely, thereby realizing a use ratio of the materials, improving production efficiency, reducing a cost. The flexible printed circuit board may be adaptable to different display devices.

DETAILED DESCRIPTION

In order to make those skilled in the art to understand the present disclosure better, the present disclosure will be described hereinafter in details in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Embodiment I

A flexible printed circuit board is provided, including a first component and a second component. The first component includes a main body and a first connection portion. At least one first signal line is arranged in the main body and the first connection portion. The second component includes a connector and a second connection portion. A second signal line corresponding to the first signal line is arranged in the connector and the second connection portion. The first connection portion and the second connection portion are connectable to each other, so as to electrically connect the first signal line to the corresponding second signal line.

The flexible printed circuit board provided by the present disclosure includes two components which are connectable to each other to realize the function of the printed circuit board. When manufacturing the flexible printed circuit board, the two components may be cut off from big sheet materials respectively. Because each component is small and of a simple shape, the components are easy to be arranged closely, thereby improving a use ratio of the materials, improving production efficiency, reducing a cost. The flexible printed circuit board may be adaptable to different display devices.

Embodiment II

Figure 1:
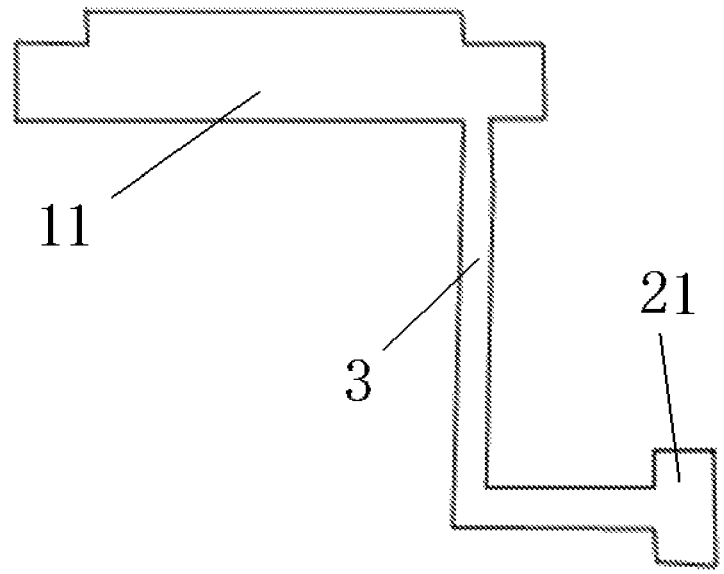
FIG. 1 is a schematic views showing a flexible printed circuit board in the related art.
Figure 2:
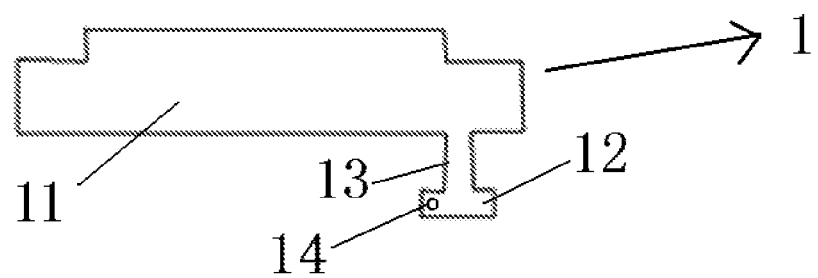
FIG. 2 is a schematic views showing a flexible printed circuit board according to an embodiment of the present disclosure.
Figure 2:
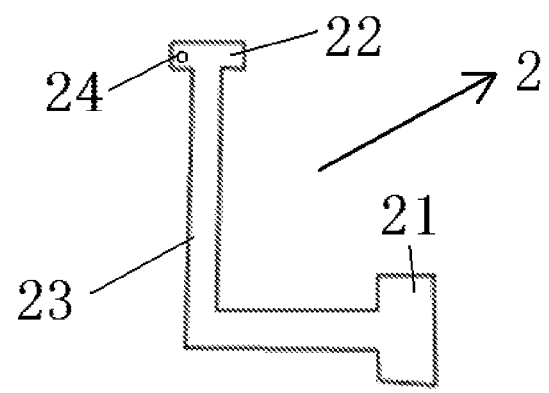
Figure 6:
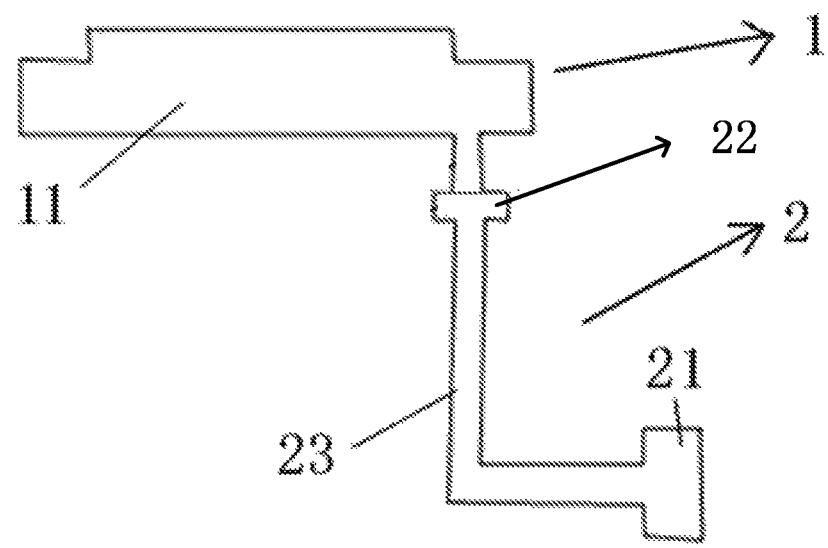
FIG. 6 is a schematic view showing a flexible printed circuit board according to an embodiment of the present disclosure.

A flexible printed circuit board is provided as shown in FIG. 2, including a first component 1 and a second component 2. The first component 1 includes a main body 11 and a first connection portion 12. At least one first signal line 15 (not shown in FIG. 2) is arranged in the main body 11 and the first connection portion 12. The second component 2 includes a connector 21 and a second connection portion 22. A second signal line 25 (not shown in FIG. 2) corresponding to the first signal line 15 is arranged in the connector 21 and the second connection portion 22. The first connection portion 12 and the second connection portion 22 are connectable to each other (such as by insertion as shown in FIG. 6), so as to electrically connect the first signal line 15 to the corresponding second signal line 25.

That is, the flexible printed circuit board includes two components. The flexible printed circuit board is connected to a liquid crystal display module via the main body 11 of the first component 1, and the flexible printed circuit board is connected to a mainboard via the connector 21 of the second component 2. The first component 1 and the second component 2 are cut off from big raw materials respectively, and then the first component 1 is electrically connected to the second component 2. To be specific, the first connection portion 12 of the first component 1 is electrically connected to the second connection portion 22 of the second component 2. The electrical connection refers to that the first signal line 15 of the first connection portion 12 is connected to and conductive with the second signal line 25 of the second connection portion 22.

Optionally, the connector 21 is flexible.

That is, the second component 2 is cut off from the big raw material of the flexible printed circuit board directly, and the connector 21 is a part of the second component 2. The connector 21 is also made of flexible materials, thereby it may be bended. To be specific, the flexible material hereinabove includes polyimide or polyethylene terephthalate (PET). When the connector 21 is applied to a display device, it may be well bended and easy to be mounted.

Optionally, the first connection portion 12 and the second connection portion 22 are bound together via a conductive double-side adhesive tape.

That is, the first connection portion 12 and the second connection portion 22 are bound together at two surfaces thereof which are opposite to each other via the conductive double-side adhesive tape, such that the first signal line 15 of the first connection portion 12 may be connected to and conductive with the second signal line 25 of the second connection portion 22.

Optionally, at least one alignment hole is arranged at each of the first connection portion 12 and the second connection portion 22.

Generally, a plurality of first signal lines 15 are arranged in the first connection portion 12, and a plurality of second signal lines 25 corresponding to the first signal lines 15 are arranged in the second connection portion 22. Therefore, in order to align the first signal lines 15 to the second signal lines 25, an alignment hole 14 is arranged in the first connection portion 12 and an alignment hole 24 is arranged in the corresponding second connection portion 22. When the first connection portion 12 is connected to the second connection portion 22, a relative position of the first and the second connection portions may be exact as long as the alignment hole 14 of the first connection portion 12 is aligned to the alignment hole 24 of the second connection portion 22, and then the first signal line 15 and the second signal line 25 may be connected exactly.

In some embodiments of the present disclosure, the first connection portion 12 and the second connection portion 22 may not be bonded together. Optionally, a first connection member is arranged in the first connection portion 12, and a second connection member is arranged in the second connection portion 22. The first connection member and the second connection member may be connected to each other by insertion, so as to electrically connect the first signal line 15 to the corresponding second signal line 25.

That is, the first connection portion 12 is made to be a slot, and the second connection portion 22 is inserted into the first connection portion 12, and then the first signal line 15 and the second signal line 25 may be connected exactly. Of course, if the second connection portion 22 is made to be a slot, the first connection portion 12 may be inserted into the second connection portion 22.

Optionally, a first intermediate portion 13 is arranged between the main body 11 and the first connection portion 12, and a second intermediate portion 23 is arranged between the connector 21 and the second connection portion 22. The first connection portion 12 is wider than the first intermediate portion 13 along a direction of a line connecting the first connection portion 12 and the first intermediate portion 13. The second connection portion 22 is wider than the second intermediate portion 23 along a direction of a line connecting the second connection portion 22 and the second intermediate portion 23.

That is, the first signal line 15 led from the main body 11 enters into the vimineous first intermediate portion 13 and then the first connection portion 12, and the second signal line 25 led from the connector 21 enters into the vimineous second intermediate portion 23 and then the second connection portion 22. The first connection portion 12 and the second connection portion 22 are both wider than the first intermediate portion 13 and the second intermediate portion 23, such that an area for bonding the first connection portion 12 and the second connection portion 22 may be enlarged, thereby strengthening the bonding of them.

Figure 3:
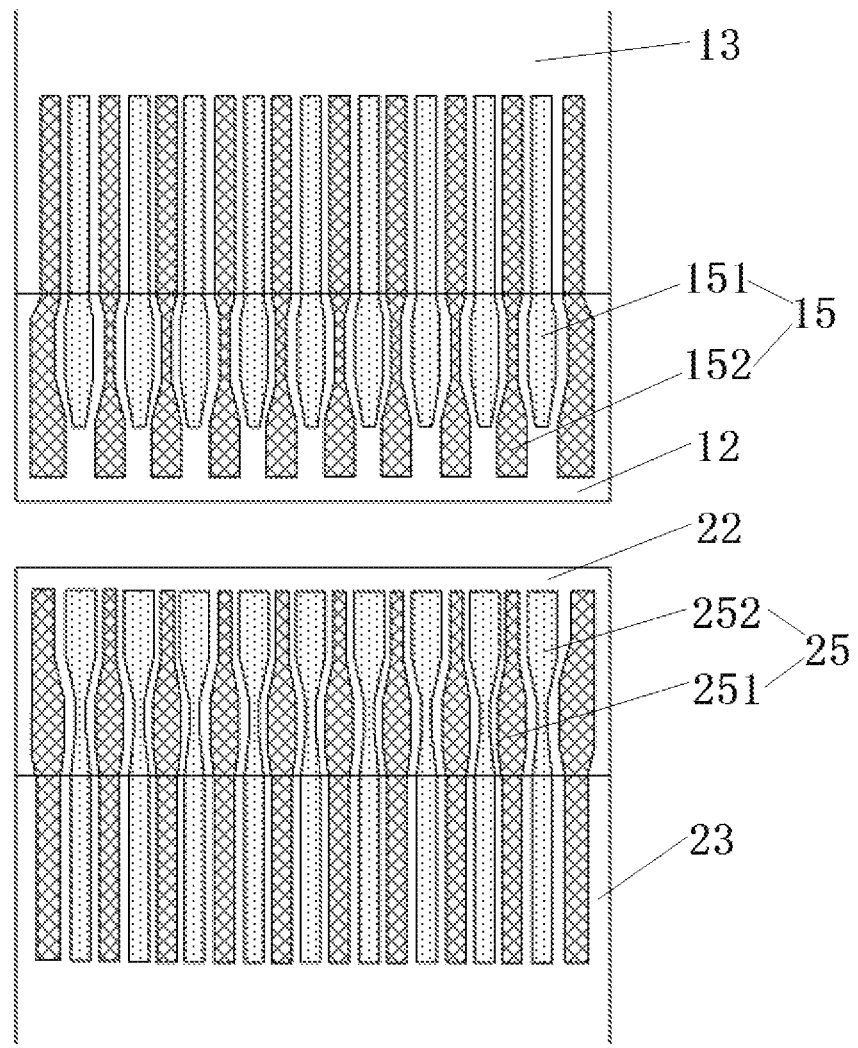
FIG. 3 is a schematic views showing a first connection portion and a second connection portion of the flexible printed circuit board according to an embodiment of the present disclosure.

Optionally, as shown in FIG. 3, each first signal line 15 include in the first connection portion 12 a widening part which is wider than the first signal line 15 in the main body 11, and the first signal 15 lines include first-type signal lines 151 and second-type signal lines 152 which are arranged alternately. A distance between the widening part of each first-type signal line 151 and the first intermediate portion 13 is different from a distance between the widening part of each second-type signal line 152 and the first intermediate portion 13.

Each second signal line 25 include in the second connection portion 22 a widening part which is wider than the second signal line 25 in the connector 21, and the second signal lines 25 include third-type signal lines 251 and fourth-type signal lines 252 which are arranged alternately. A distance between the widening part of each third-type signal line 251 and the second intermediate portion 23 is different from a distance between the widening part of each fourth-type signal line 252 and the second intermediate portion 23.

That is, each first signal line 15 has a widening part at its one end, so as to enlarge the connection area. Obviously, if the widening parts of all the first signal lines 15 are arranged at the same positions of the first signal lines 15, a transverse space is not enough, so the first signal lines 15 include two types which are arranged alternately, and the widening parts of the two types of signal lines are arranged staggerly. That is, at two sides of the widening part of one type of signal lines, the other type of signal lines are narrowed or does not exist, thereby there may be enough space for accommodating the widening parts.

As shown in FIG. 3, a width of each first-type signal line 151 is identical to a width of each second-type signal line 152 at the first intermediate portion 13. The first-type signal lines 151 and the second-type signal lines 152 are arranged alternately. An end of the first-type signal line 151 at the first connection portion 12 closing to the main body 11 is wider than the first-type signal line 151 at the first intermediate portion 13, and an end of the first-type signal line 151 at the first connection portion 12 closing to the connector 21 is narrower than the first-type signal line 151 at the first intermediate portion 13. An end of the second-type signal line 152 at the first connection portion 12 closing to the main body 11 is narrower than the second-type signal line 152 at the first intermediate portion 13, and an end of the second-type signal line 152 of the first connection portion 12 closing to the connector 21 is wider than the second-type signal line 152 at the first intermediate portion 13.

The third-type signal lines 251 and the fourth-type signal lines 252 at the second connection portion 22 are arranged in the same way. An end of the third-type signal line 251 closing to the connector 21 is wider than the third-type signal line 251 at the second intermediate portion 23, and an end of the third-type signal line 251 at the second connection portion 22 closing to main body 11 is narrower than the third-type signal line 251 at the second intermediate portion 23. An end of the fourth-type signal line 252 at the second connection portion 22 is narrower than the fourth-type signal line 252 at the second intermediate portion 23, and an end of the fourth-type signal line 252 at the second connection portion 22 closing to the main body 11 is wider than the fourth-type signal line 252 at the second intermediate portion 23.

Figure 4:
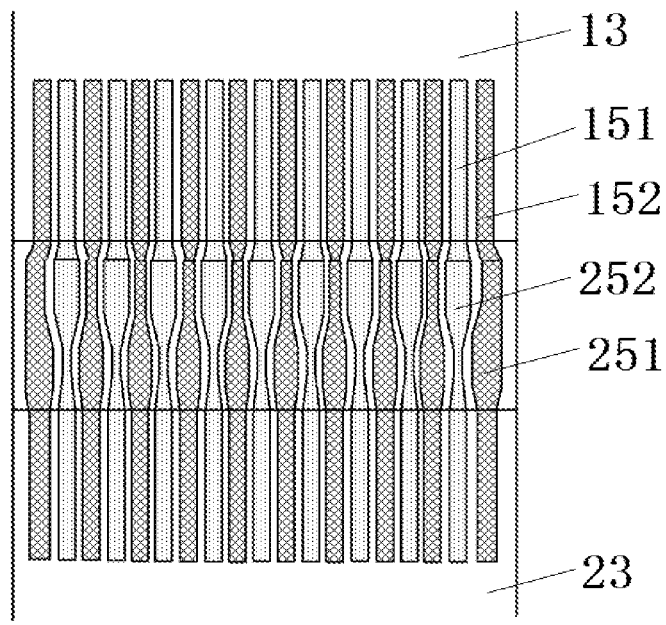
FIG. 4 is a schematic views showing the first connection portion and the second connection portion of the flexible printed circuit board which are electrically connected to each other according to an embodiment of the present disclosure.

As shown in FIG. 4, when the first connection portion 12 is connected to the second connection portion 22, the widening part of the first-type signal line 151 may be connected to the widening part of the fourth-type signal line 252, and the widening part of the second-type signal line 152 may be connected to the widening part of the third-type signal line 251, thereby areas for connecting the signal lines may be enlarged, and then a more reliable connection may be realized.

Optionally, an aggregate thickness of a portion formed by connecting the first connection portion and the second connection portion is 0.1-0.2 mm.

That is, the portion formed by connecting the first connection portion 12 and the second connection portion 22 may not be too thick. If the portion formed by connecting the first connection portion and the second connection portion is so thick that the flexible printed circuit board may be not bended easily, the use of the flexible printed circuit board may be influenced.

Figure 5:
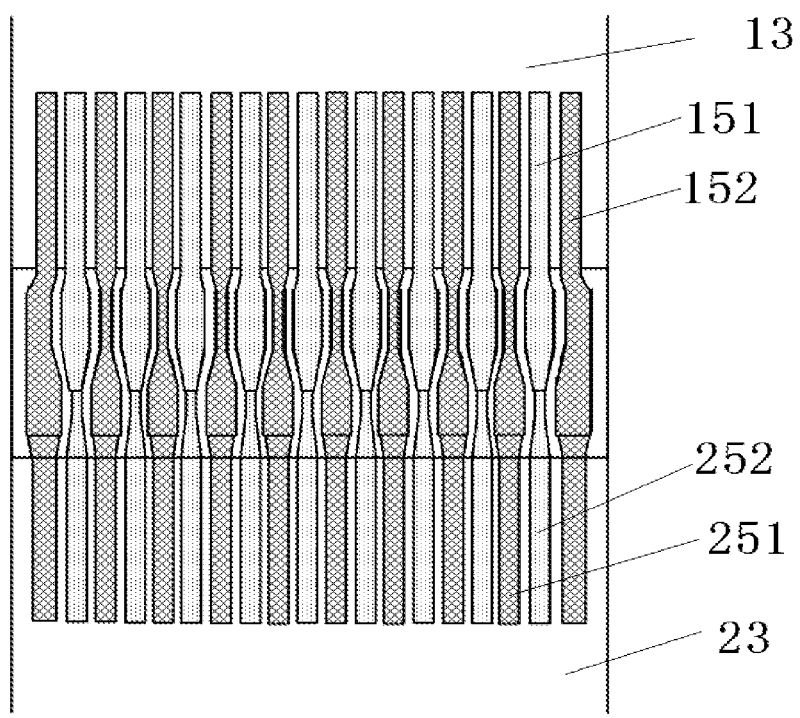
FIG. 5 is a schematic view showing a first connection portion and a second connection portion of another flexible printed circuit board which are electrically connected to each other according to an embodiment of the present disclosure.

Obviously, several alternations may be made to the embodiments hereinabove. For example, the first connection portion 12 may be connected to the second connection portion 22 in other ways. As shown in FIG. 4, the second connection portion 22 may be bonded with the first connection portion 12 above the first connection portion 12, or the first connection portion 12 may be bonded with the second connection portion 22 above the second connection portion 22, as shown in FIG. 5.

Embodiment III

A method for manufacturing a flexible printed circuit board is provided by some embodiments of the present disclosure, including:

a step of forming a first component 1, wherein the first component 1 includes a main body 11, a first connection portion 12 and at least one first signal line 15;

a step of forming a second component 2, wherein the second component 2 includes a connector 21, a second connection portion 22 and at least one second signal line 25; and a step of aligning and connecting the first connection portion 12 of the first component 1 to the second connection portion 22 of the second component 2, so as to electrically connect the first signal line 15 to a corresponding second signal line 25.

Optionally, the step of aligning and connecting the first connection portion 12 of the first component 1 to the second connection portion 22 of the second component 2 includes:

binding the first connection portion 12 and the second connection portion 22 together via a conductive double-side adhesive tape.

In the related art, the main body 11 is connected to a display panel via a binding process. According to some embodiments of the present disclosure, the binding process in the related art is used when binding the first connection portion 12 and the second connection portion 22 together via a conductive double-side adhesive tape, and there is no need to use new devices and technologies.

Optionally, the binding is performed at 140-160 degrees centigrade and at a binding pressure of 5-20 MPa for 4-8 seconds.

That is, the binding effect may be best when binding the first connection portion 12 and the second connection portion 22 together under the conditions hereinabove.

According to some embodiments of the present disclosure, the method may further includes forming a first connection member in the first connection portion 12 and forming a second connection member in the second connection portion 22 rather than binding the first connection portion 12 and the second connection portion 22 together.

At this time, the step of aligning and connecting the first connection portion 12 of the first component 1 to the second connection portion 22 of the second component 2 includes: connecting the first connection member and the second connection member to each other by insertion, so as to electrically connect the first signal line 15 to the corresponding second signal line 25.

Embodiment IV

A display device is further provided by some embodiments of the present disclosure, including the flexible printed circuit board hereinabove. The display device may be a liquid crystal display panel, an OLED panel, a cell phone, a tablet PC, a television, a displayer, a laptop or any other products or components with display function.

To be specific, the display device may include a liquid crystal display module and a mainboard. The flexible printed circuit board is connected to the liquid crystal display module via the first component, and flexible printed circuit board is connected to the mainboard via the second component, so as to arrange the mainboard behind the liquid crystal display module.

It may be understood that, the above are merely the preferred embodiments of the present disclosure, but the present disclosure is not limited herein. A person skilled in the art may make further modifications and improvements without departing from the principle/spirit of the present disclosure, and these modifications and improvements shall also fall within the scope of the present disclosure.

What is claimed is:

1. A flexible printed circuit board, comprising a first component and a second component, wherein:

the first component comprises a main body and a first connection portion, wherein at least one first signal line is arranged in the main body and the first connection portion;

the second component comprises a connector and a second connection portion, wherein a second signal line corresponding to the first signal line is arranged in the connector and the second connection portion;

the first connection portion and the second connection portion are connectable to each other, so as to electrically connect the first signal line to the corresponding second signal line;

each first signal line has a uniform width in the main body and comprises in the first connection portion a widening part that is wider than the uniform width of the first signal line in the main body, and the first signal lines comprise first-type signal lines and second-type signal lines that are arranged alternately, wherein a distance between the widening part of each first-type signal line and an interface between the main body and the first connection portion is different from a distance between the widening part of each second-type signal line and the interface, and each second-type signal line comprises in the first connection portion a narrow part having a width that is less than the uniform width of the first signal line in the main body;

each second signal line has a uniform width in the connector and comprises in the second connection portion a widening part that is wider than the uniform width of the second signal line in the connector and a narrow part having a width that is less than the uniform width of the second signal line in the connector, and the second signal lines comprise third-type signal lines and fourth-type signal lines that are arranged alternately and have a same length in the second connection portion, wherein a distance between the widening part of each third-type signal line and the connector is same as that between the narrow part of each fourth-type signal line and the connector, and a distance between the narrow part of each third-type signal line and the connector is same as that between the widening part of each fourth-type signal line and the connector.

2. The flexible printed circuit board according to claim 1, wherein the connector is flexible.

3. The flexible printed circuit board according to claim 1, wherein the first connection portion and the second connection portion are bound together via a conductive double-side adhesive tape.

4. The flexible printed circuit board according to claim 1, wherein a first connection member is arranged in the first connection portion, and a second connection member is arranged in the second connection portion;
the first connection member and the second connection member are connectable to each other by insertion, so as to electrically connect the first signal line to the corresponding second signal line.

5. The flexible printed circuit board according to claim 1, wherein at least one alignment hole is arranged at each of the first connection portion and the second connection portion.

6. The flexible printed circuit board according to claim 1, wherein an aggregate thickness of a portion formed by connecting the first connection portion and the second connection portion is 0.1-0.2 mm.

7. A display device, comprising the flexible printed circuit board according to claim 1.

8. The display device according to claim 7, wherein the connector is flexible.

9. The display device according to claim 7, wherein a first connection member is arranged in the first connection portion, and a second connection member is arranged in the second connection portion;
the first connection member and the second connection member are connectable to each other by insertion, so as to electrically connect the first signal line to the corresponding second signal line.

10. The display device according to claim 7, wherein at least one alignment hole is arranged at each of the first connection portion and the second connection portion.

11. The display device according to claim 7, wherein an aggregate thickness of a portion formed by connecting the first connection portion and the second connection portion is 0.1-0.2 mm.

12. The display device according to claim 7, wherein
a first intermediate portion is arranged between the main body and the first connection portion, and a second intermediate portion is arranged between the connector and the second connection portion;
the first connection portion is wider than the first intermediate portion along a direction of a line connecting the first connection portion and the first intermediate portion; and
the second connection portion is wider than the second intermediate portion along a direction of a line connecting the second connection portion and the second intermediate portion.

13. The flexible printed circuit board according to claim 1, wherein:
the narrow part of each second-type signal line has a front part close to the main body with a width that gradually decreases in a direction away from the main body, a middle part with a uniform width, and a rear part away from the main body with a width that gradually increases in the direction away from the main body;
the narrow part of each fourth-type signal line has a front part close to the connector with a width that gradually decreases in a direction away from the connector, a middle part with a uniform width, and a rear part away from the connector with a width that gradually increases in the direction away from the connector;
the widening part of each first-type signal line matches the narrow part of each second-type signal line; and
the first connection portion is bonded with the second connection portion above the second connection portion, each first-type signal line in the first connection portion is arranged on its corresponding fourth-type signal line in the second connection portion, and each second-type signal line in the first connection portion is arranged on its corresponding third-type signal line in the second connection portion; or the second connection portion is bonded with the first connection portion above the first connection portion, each fourth-type signal line in the second connection portion is arranged on its corresponding first-type signal line in the first connection portion, and each third-type signal line in the second connection portion is arranged on its corresponding second-type signal line in the first connection portion.

14. The flexible printed circuit board according to claim 1, wherein:
the first connection portion is bonded with the second connection portion above the second connection portion, and each first signal line in the first connection portion is arranged on its corresponding second signal line in the second connection portion; or
the second connection portion is bonded with the first connection portion above the first connection portion, each second signal line in the second connection portion is arranged on its corresponding first signal line in the first connection portion.

15. The display device according to claim 1, wherein
a first intermediate portion is arranged between the main body and the first connection portion, and a second intermediate portion is arranged between the connector and the second connection portion;

the first connection portion is wider than the first intermediate portion along a direction of a line connecting the first connection portion and the first intermediate portion; and the second connection portion is wider than the second intermediate portion along a direction of a line connecting the second connection portion and the second intermediate portion.

16. A method for manufacturing a flexible printed circuit board, comprising:

aligning and connecting a first connection portion of a first component to a second connection portion of a second component, so as to electrically connect a first signal line to a corresponding second signal line;

wherein the first component comprises a main body and the first connection portion, and at least one first signal line is arranged in the main body and the first connection portion;

the second component comprises a connector and the second connection portion, and the second signal line corresponding to the first signal line is arranged in the connector and the second connection portion;

each first signal line has a uniform width in the main body and comprises in the first connection portion a widening part that is wider than the uniform width of the first signal line in the main body, and the first signal lines comprise first-type signal lines and second-type signal lines that are arranged alternately, wherein a distance between the widening part of each first-type signal line and an interface between the main body and the first connection portion is different from a distance between the widening part of each second-type signal line and the interface, and each second-type signal line comprises in the first connection portion a narrow part having a width that is less than the uniform width of the first signal line in the main body; and each second signal line has a uniform width in the connector and comprises in the second connection portion a widening part that is wider than the uniform width of the second signal line in the connector and a narrow part having a width that is less than the uniform width of the second signal line in the connector, and the second signal lines comprise third-type signal lines and fourth-type signal lines that are arranged alternately and have a same length in the second connection portion, wherein a distance between the widening part of each third-type signal line and the connector is same as that between the narrow part of each fourth-type signal line and the connector, and a distance between the narrow part of each third-type signal line and the connector is same as that between the widening part of each fourth-type signal line and the connector.

17. The method according to claim 16, wherein the step of aligning and connecting the first connection portion of the first component to the second connection portion of the second component comprises:

binding the first connection portion and the second connection portion together via a conductive double-side adhesive tape.

18. The method according to claim 17, wherein the binding is performed at 140-160 degrees centigrade and at a binding pressure of 5-20 MPa for 4-8 seconds.

19. The method according to claim 16, further comprising forming a first connection member in the first connection portion and forming a second connection member in the second connection portion; and the step of aligning and connecting the first connection portion of the first component to the second connection portion of the second component comprises:

connecting the first connection member and the second connection member to each other by insertion, so as to electrically connect the first signal line to the corresponding second signal line.

\* \* \* \* \*